United States Patent [19]

Matsumura et al.

[11] Patent Number: 4,694,428

[45] Date of Patent: Sep. 15, 1987

[54] SEMICONDUCTOR MEMORY

[75] Inventors: Tsuneo Matsumura, Yokohama; Tsuneo Mano, Isehara; Junzo Yamada, Ebina; Junichi Inoue, Zama, all of Japan

[73] Assignee: Nippon Telegraph and Telephone Corporation, Tokyo, Japan

[21] Appl. No.: 789,846

[22] Filed: Oct. 21, 1985

[30] Foreign Application Priority Data

Nov. 2, 1984 [JP] Japan ............................... 59-232083

[51] Int. Cl.⁴ ................................................ G11C 7/00
[52] U.S. Cl. ...................................... 365/189; 365/51; 365/63
[58] Field of Search ...................... 365/51, 63, 72, 189

[56] References Cited

U.S. PATENT DOCUMENTS 4,551,820 11/1985 Matsuura ............................ 365/189
4,615,021 9/1986 Yoshida et al. ..................... 365/189

Primary Examiner—Joseph A. Popek
Attorney, Agent, or Firm—Staas & Halsey

[57] ABSTRACT

In a semiconductor memory, a memory cell array is divided into a plurality of sub arrays in a direction perpendicular to word lines. In each sub array sub word lines and bit lines are disposed to intersect each other and memory cells are disposed at all their intersections. Two different sub arrays constitute a unit cell array. The sub word line connected to a cell transistor in one of or the first the sub arrays of the unit cell array is connected to a first main word line and a second main word line which is not connected to the cell transistor in the first sub array is passed therethrough for connection with the sub word line of the other or second sub array in the unit cell array.

10 Claims, 16 Drawing Figures

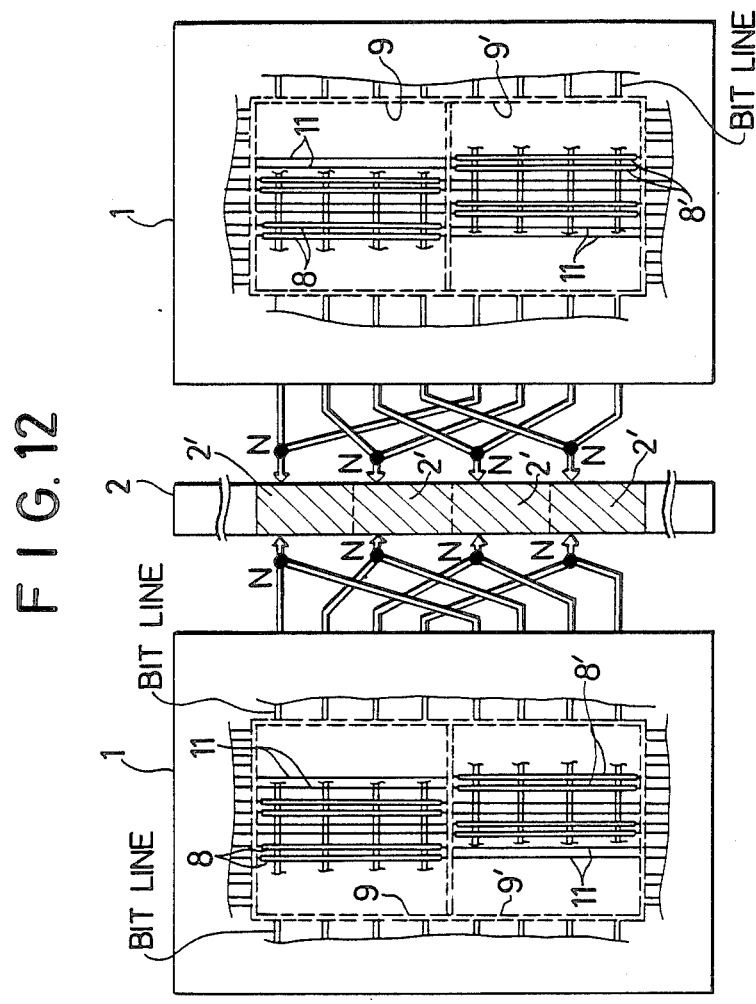
F I G. 12

SEMICONDUCTOR MEMORY

BACKGROUND OF THE INVENTION

1. Field of the Invention

The present invention relates to a semiconductor memory, and, more particularly, to a memory cell architecture which permits a reduction in the pitch of the memory cells thereby increasing the packing density of a memory cell array.

2. Description of the Related Art

The memory cell architecture for semiconductor memories is roughly divided into two types: open bit line architecture and folded bit line architecture. FIG. 1 shows an example of a semiconductor memory which employs the open bit line architecture. In FIG. 1, reference numeral 1 indicates memory cell arrays, 2 a sense amplifier column, 3 a column decoder and 4 row decoders. A hatched area 2' in the sense amplifier column 2 represents a single sense amplifier (the effective area of one sense amplifier circuit). A pair of bit lines connected to one sense amplifier circuit are indicated by BL and $\overline{BL}$. In practice, word lines are provided to extend across the bit lines BL and $\overline{BL}$, but in FIG. 1, they are not shown. FIG. 2 illustrates a specific operative structure of the memory cell array 1 of the semiconductor memory depicted in FIG. 1. FIG. 2 shows, by way of example, a two cell-one contact structure. Reference numeral 5 designates a contact, 6 a memory cell, 6' a gate portion of a cell transistor, 14 a diffused region and 15 a cell plate. In FIG. 2, only one memory cell 6 is indicated by the broken-line square, but in practice, a cell is formed at each intersection of the word lines and the bit lines. In FIG. 2, each diffused region 14 has formed therein two cell transistors, and the contact which is connected to their drains is disposed between their hatched gate portions 6'. Reference character F indicates feature size used in the design of this example. In this example, the cell plate 15 which serves as an electrode for forming the capacitance of the memory cell 6 (indicated by the broken line) and the word line are formed of the same material through use of a one-layer gate process technique. The widths and the spacing of the contacts 5, the bit and word lines BL and WL, the cell plates 15 and so forth are defined by the feature size F. The spacing of the diffused regions 14 is set to 3F (the minimum spacing) due to limitations on the process for the formation of the isolating region between diffused regions. In other words, the spacing of the diffused regions 14 cannot be made smaller than 3F. The cell pitch x in the direction of the bit line BL and the cell pitch y in the direction of the word line WL, based on the above design criteria, are such as shown in FIG. 2 in which x=7F and y=6F. These values are implemented with the spacing of the diffused regions 14 set to the minimum spacing 3F.

An open bit line architecture, as depicted in FIGS. 1 and 2, is suitable for close packing of memory cell arrays, as compared with the folded bit line architecture described below. With the open bit line architecture, however, a decrease in the minimum pattern width causes an increase in the relative area occupied by the sense amplifier for each circuit. As a result, the pitch of the sense amplifiers creates an obstacle to the formation of high-density memory cell arrays, introducing difficulties in the circuit design and layout of the sense amplifiers.

On the other hand, the folded bit line architecture has widely been employed as an architecture which overcomes the limitations on the pitch of the sense amplifiers. FIG. 3 shows an example of a semiconductor memory utilizing the folded bit line architecture and FIG. 4 is a specific example of folded bit line memory cell architecture. In FIGS. 3 and 4 like parts corresponding to those in FIGS. 1 and 2 are identified by the same reference numerals. In the illustrated example, memory cells, each connected to given word lines, are connected to alternate bit lines, as depicted in FIG. 4. Accordingly, two word lines pass across each memory cell 6 within one cell pitch x in the direction of the bit lines, as indicated by WL1 and WL2. In this example, with respect to the memory cell 6 indicated by the broken line block, the word line WL1 is one that forms the gate portion 6' of the cell transistor, and the word line WL2 is a passing through word line. In this instance, the word line WL2 extends a distance from the contact region related to the memory cell 6 and the other cell and does not overlap the diffused region 14 within one cell pitch so as to prevent the formation of a transistor. In FIG. 4, the spacing of the word lines WL1 and WL2 and the cell plates 15 is defined by the feature size F. Using the same design criteria as that used in Fig. 2, the cell pitch x in the direction of the bit lines and the cell pitch y in the direction of the word lines are 9F and 6F, respectively, clearly indicating that the cell pitch x is larger than in the case of FIG. 2. Accordingly, the folded bit line architecture cannot achieve the high-density memory cell array of FIG. 2.

FIGS. 5 and 6 illustrate folded bit line architectures which are employed when the pitch of the sense amplifiers exceeds the cell pitch y or 2y. In FIGS. 5 and 6, like parts corresponding to those in FIGS. 1 through 4 are identified by the same reference numerals. Reference numeral 7 indicates change-over switches and 13 multiplexers.

In FIG. 5, the sense amplifier columns 2 are disposed on both sides of the memory cell array 1 and the multiplexers 13, having a cell data readout or write control function, are disposed on both sides of the memory cell array 1, each corresponding to one pair of bit lines BL and $\overline{BL}$.

In FIG. 6, the change-over switches 7 are disposed on both sides of the memory cell array 1 to selectively connect thereto the bit line pairs BL, $\overline{BL}$, and the multiplexer 13 is disposed on only one side of the memory cell array 1, so that a read and a write of cell data are effected through the multiplexer 13 alone.

With the folded bit line architectures shown in Figs. 5 and 6, the sense amplifiers can be arranged at a pitch four times as large as the cell pitch y in the direction of the word lines. As is the case with FIGS. 3 and 4, however, these folded bit line architectures also encounter the problem that the cell pitch x in the direction of bit lines is a barrier to the construction of high-density memory cell arrays.

SUMMARY OF THE INVENTION

It is an object of the present invention to provide a semiconductor memory which has a memory cell array with a folded bit line architecture which permits the reduction of the cell pitch in the direction of the bit lines.

Another object of the present invention is to provide a semiconductor memory which allows the easy circuit design and layout of sense amplifiers in a memory cell array with the open bit line architecture.

The basic arrangement of the semiconductor memory of the present invention is as follows. A memory cell array is divided into a plurality of sub arrays in a direction perpendicular to the word lines. In each sub array, sub word lines and bit lines are arranged to intersect each other and memory cells are disposed at all the intersections of the sub word lines and the bit lines. Such sub arrays are combined into a unit cell array. A sub word line, which is connected to a cell transistor in a first one of the sub arrays forming the unit cell array, is connected to a first main word line, whereas a sub word line connected to a cell transistor in the another or second sub array is connected to a different or second main word line. The first main word line passes through the second sub array and the second main word line passes through the frst sub array without respective connection therein.

In the semiconductor memory with the folded bit line architecture according to the present invention, bit lines which belong to different sub arrays of the unit cell array constitute a bit line pair. The main word lines, which are not connected to the cell transistor in a first of the sub arrays, are formed to pass through the frst sub array for connection with the sub word line of the second sub array. In this case, the main word line passing through the first sub array and the sub word line for the first sub array can be formed in different layers. The passing main word line need not go around the contact region of the memory cell and may also overlap the diffused region within one cell pitch. Accordingly, it is possible to obtain a semiconductor memory of the folded bit line architecture which has a high-density, large-capacity memory cell array.

The above basic structure is applicable as well to a semiconductor memory of the open bit line architecture in which memory cell arrays are disposed on both sides of a sense amplifier and bit lines from the respective memory cell arrays form a bit line pair. This makes it possible to arrange sense amplifiers at a pitch twice the cell pitch y in the direction of the word lines in spite of the open bit line architecture, allowing ease in the circuit design and layout of the sense amplifiers.

Other objects, features and advantages of the present invention will become more fully apparent from the following detailed description taken in conjunction with the accompanying drawings.

BRIEF DESCRIPTION OF THE DRAWINGS

FIG. 12 is a diagram illustrating another embodiment of the present invention which employs the open bit line architecture and does not use any changeover switches.

DESCRIPTION OF THE PREFERRED EMBODIMENTS

Figure 7:
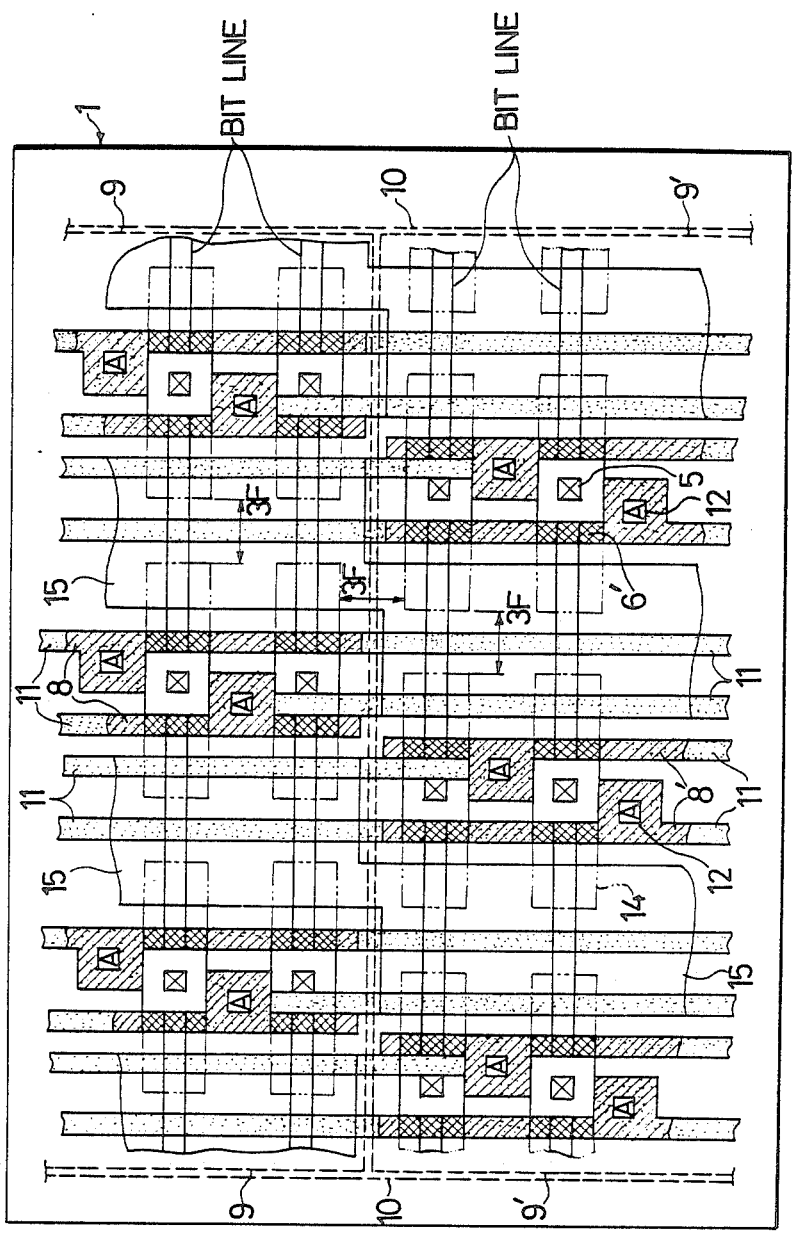
FIG. 7 is a detailed fragmentary diagram illustrating a planar memory cell architecture in an embodiment of the present invention.

FIG. 7 is a detailed fragmentary diagram illustrating an embodiment of the present invention. In FIG. 7, like parts corresponding to those in FIGS. 1 through 6 are identified by the same reference numerals. Reference numeral 1 indicates a memory cell array, 5 contacts, 6' gate portions of cell transistors, 8 and 8' sub word lines, 9 and 9' sub arrays, 10 unit cell arrays, 11 main word lines, 12 through holes and 14 diffused regions.

In FIG. 7, the sub word lines 8 and 8' (hatched area in FIG. 7) are provided corresponding to a plurality of memory cells and the sub arrays 9 and 9' including the plurality of sub word lines 8 or 8' are combined into the unit cell array 10. In each sub array, memory cells are disposed at all intersections of the sub word lines 8 or 8' and the bit lines. In this embodiment, the main word lines 11 (shaded with dots in FIG. 7) which are electrically connected with the sub word lines 8 ( or 8') in the first sub array 9 (or 9') pass through the other or second sub array 9' (or 9) without being connected therein to the sub word lines 8' (or 8) using the through holes 12. In this instance, the sub word lines 8 and 8' and the cell plates 15 are formed in the same layer and the passing main word lines 11 are formed by an interconnection layer which is different from the layer of the sub word line 8. Therefore, the main word lines 11 passing through the second sub array 9' (or 9) need not go round the regions of the contacts 5 in the first sub array 9' (or 9) and may also overlap the diffused regions 14 within one cell pitch. Accordingly, the density of the memory cell array can be increased in the direction of bit lines. The main word lines 11 are provided over all the sub arrays corresponding to the word lines in the memory cell array shown in FIGS. 2 and 4. In FIG. 7, the main word lines 11 are each connected via the through hole 12 to the sub word line 8 or 8'.

Incidentally, the sub word lines 8 (or 8') of the sub arrays 9 (or 9') are shifted relative to each other in the direction of bit lines in FIG. 7, but in the present invention, they have no particular dependence upon each other with respect to their positional relationship. Accordingly, the present invention is not limited specifically to the arrangement in which the sub word lines 8 (or 8') of the different sub arrays 9 (or 9') are staggered in the direction of bit lines, as depicted in FIG. 7.

According to the above embodiment, the spacing of the diffused regions 14 in the direction of bit lines can be made to be the minimum spacing 3F, as is the case with the open bit line architecture described previously in connection with FIG. 1. Therefore, the cell pitch x in the direction of bit lines becomes 7F, permits high-density formation of the memory cell array. Now, consider a memory of a 1 Mb (1 mega bit) storage capacity in which 1024×1024 memory cell arrays are arranged, with the feature size F set to 1 $\mu$m.

Figure 4:
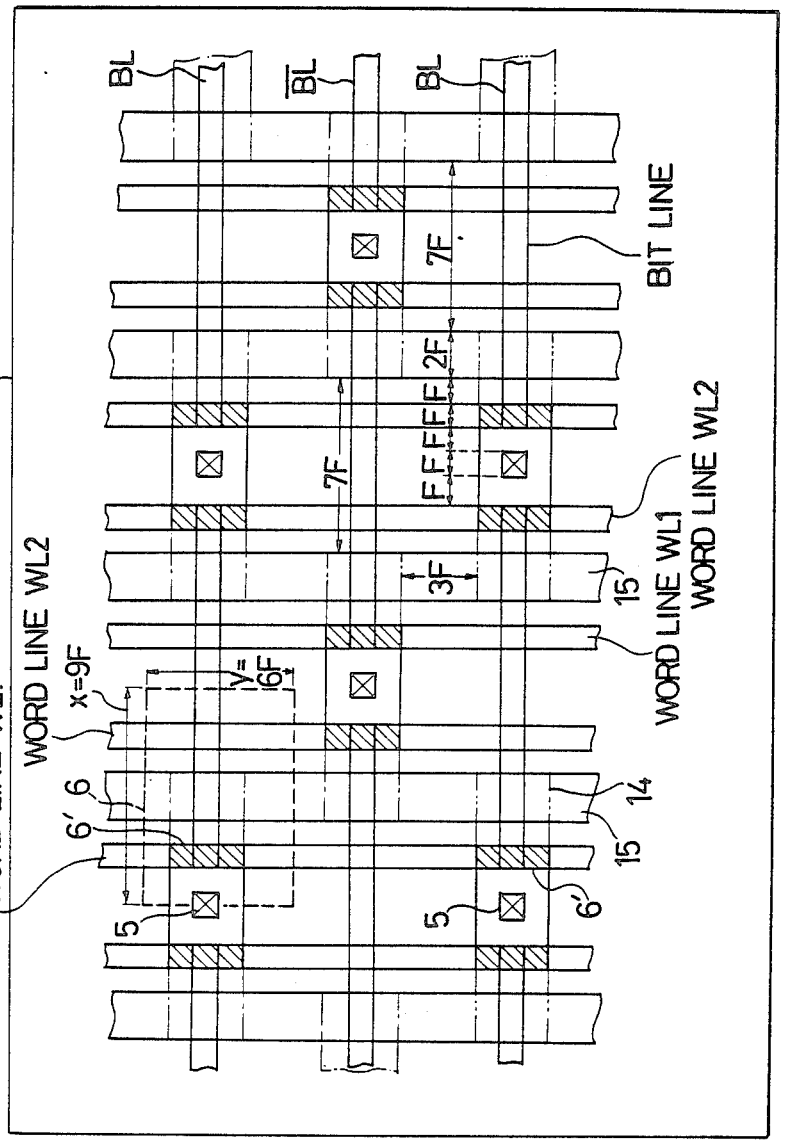
FIG. 4 is a diagram showing in detail conventional memory cell arrays in the semiconductor memory depicted in FIG. 3.

With the arrangement of the embodiment shown in Fig. 7, since the cell pitch x in the direction of bit lines is 2F smaller than in the case of the conventional arrangement of FIG. 4, the entire length of the cell array becomes shorter by 1024=2F=1024×2 $\mu$m, i.e. about 2 mm. On the other hand, the cell pitch y in the direction of word lines can be held at 6F since the bit lines can each be passed within the minimum spacing 3F of the diffused regions 14.

Figure 1:
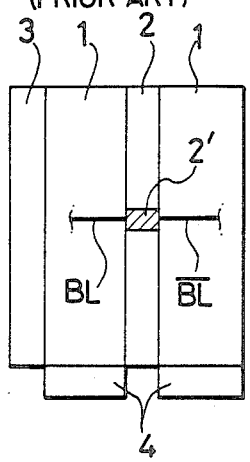
FIG. 1 is a diagram showing the outline of a semiconductor memory employing an open bit line architecture.
Figure 3:
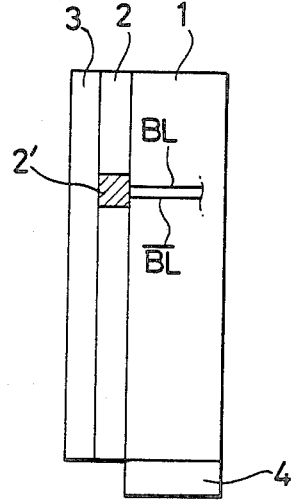
FIG. 3 is a diagram showing the outline of a semiconductor memory employing a folded bit line architecture.
Figure 5:
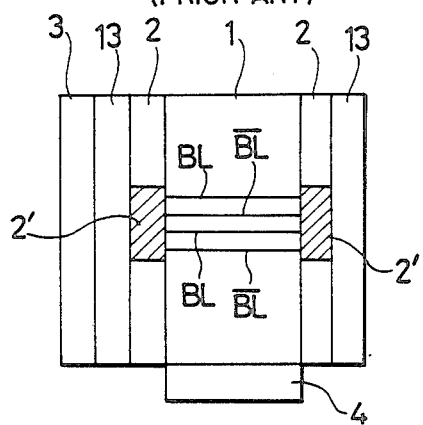
FIG. 5 is a diagram showing the outline of a semiconductor memory with a folded bit line architecture in which sense amplifiers and multiplexers are both disposed on both sides of a memory cell array in FIG. 3.
Figure 6:
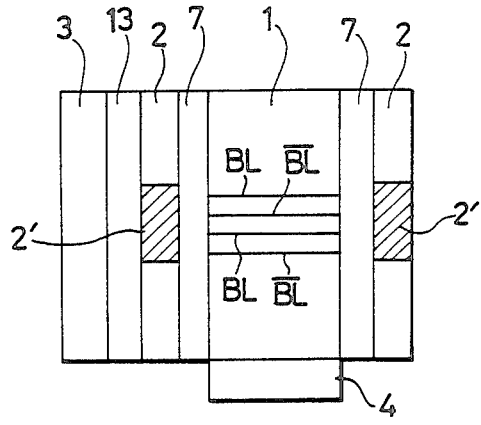
FIG. 6 is a diagram showing the outline of a semiconductor memory with a folded bit line architecture in which sense amplifiers and change-over switches are both disposed on both sides of a memory cell array in FIG. 3.
Figure 2:
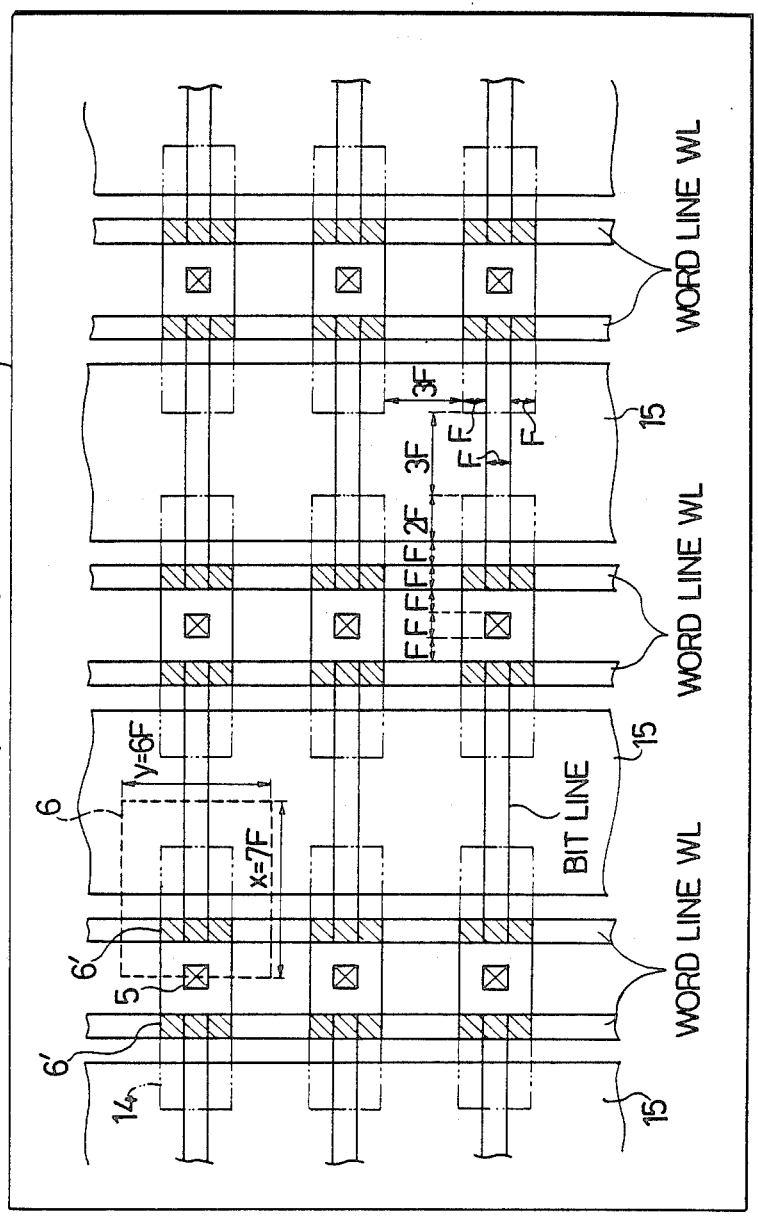
FIG. 2 is a fragmentary diagram showing in detail a planar memory cell architecture in the semiconductor memory depicted in FIG. 1.
Figure 8:
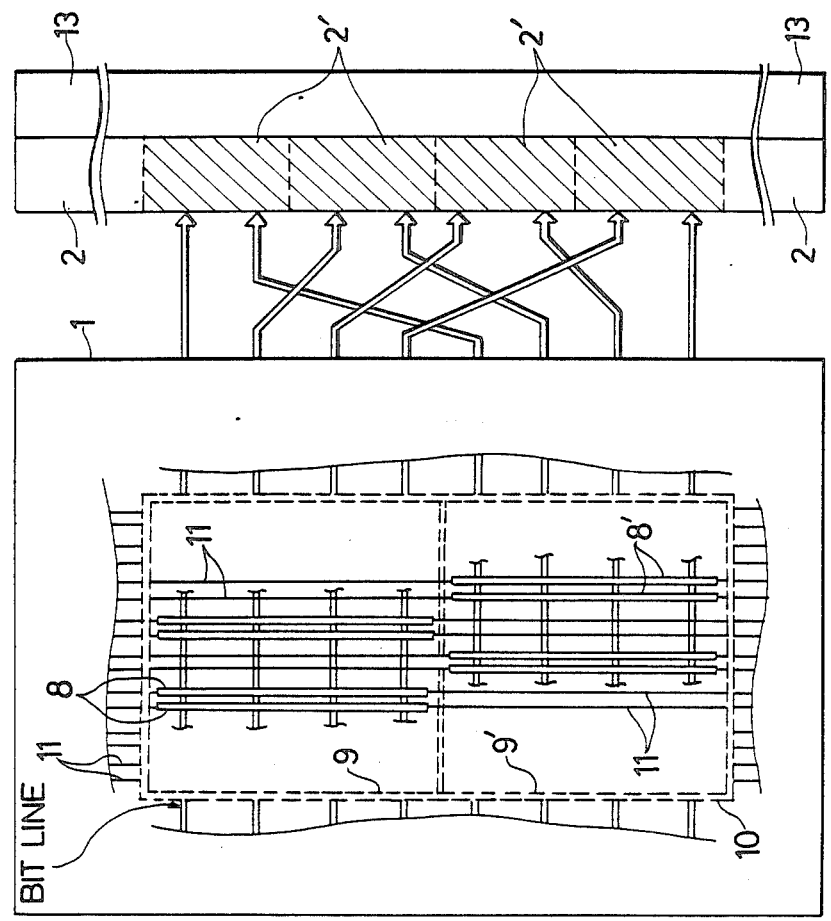
FIG. 8 is a diagram showing the outline of a semiconductor memory which employs the folded bit line architecture depicted in FIG. 7.

FIG. 8 illustrates a part of the folded bit line architecture in which the sense amplifier column 2 is disposed on one side of the memory cell array 1 of FIG. 7, the bit lines of the sub array 9 and the bit lines of the sub array 9' form bit line pairs and these bit line pairs are connected to the sense amplifiers 2' of one circuit. In FIG. 8, like parts corresponding to those in FIGS. 1 and 7 are identified by the same reference numerals and the sub arrays 9 and 9' are combined into the unit cell array 10 as referred to above with respect to FIG. 7.

While FIG. 8 shows the case where four bit lines are connected per sub word line 8 or 8', the number of bit lines can be freely selected in the present invention.

Figure 9B:
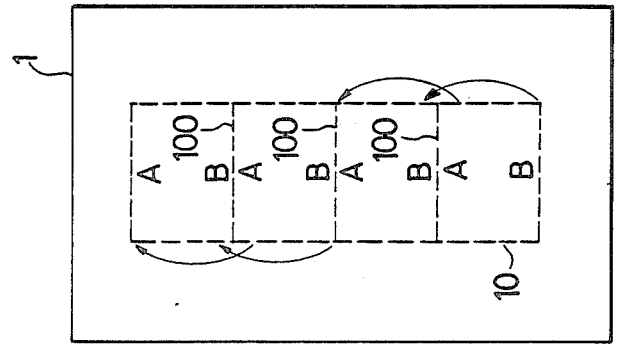
FIG. 9A and 9B are diagrams each explanatory of a method for forming the entire memory cell array using a plurality of unit cell arrays in FIG. 8.
Figure 9A:
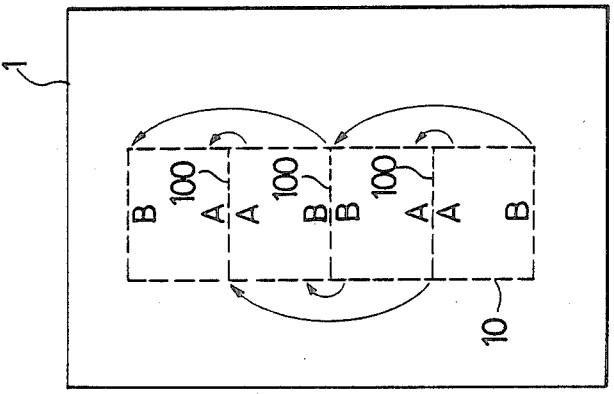
Figure 9C:
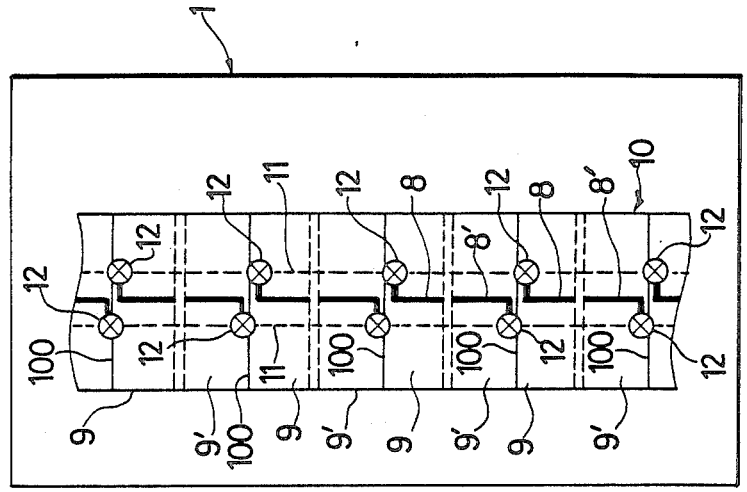
FIGS. 9C and 9D are detailed diagrams showing the memory cell architecture of FIGS. 9A and 9B, respectively.
Figure 9D:
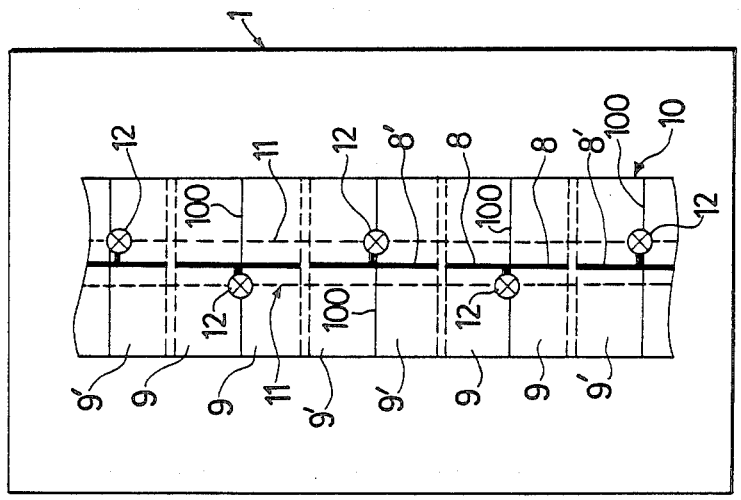

In the present invention, the memory cell array 1 including a plurality of such unit cell arrays 10 can be formed by using either of the methods depicted in FIGS. 9A and 9B. In FIG. 9A, the memory cell array 1 is formed by folding the unit cell array 10 symmetrically with respect to the boundary 100 between the adjoining unit cell arrays 10 in the direction perpendicular to the main word lines 11. In FIG. 9B the memory cell array 1 is formed without folding the unit cell array 10. FIG. 9C shows the detailed structure of FIG. 9A, and FIG. 9D the detailed structure of FIG. 9B. The reference numerals are the same as those used in FIGS. 7 and 8. FIGS. 9C and 9D both partially show the first and second sub arrays 9 and 9' disposed along two main word lines 11 of the memory cell array 1.

In FIG. 9C, since each unit cell array 10 is folded back symmetrically with respect to the boundary 100 between the adjoining unit cell arrays 10 in the direction perpendicular to the main word lines 11, as mentioned above, the sub word lines 8 or 8' in the sub arrays 9 or 9' belonging to different unit cell arrays 10 on both sides of the boundary 100 therebetween are connected to the same main word line 11. Accordingly, as shown in FIG. 9C, these sub word lines 8 or 8' are interconnected and one through hole 12 is provided for each pair of interconnected sub word lines 8 or 8'.

On the other hand, in FIG. 9D, since the memory cell array 1 is formed without folding the unit cell arrays 10, the sub word lines 8 and 8' of the first and second sub arrays 9 and 9' of the same unit cell array 10 are connected to different main word lines 11, so that number of through holes 12 needed becomes two-fold.

According to this embodiment, as is evident from FIG. 8, the advantage of the conventional folded bit line architecture is retained and the sense amplifiers can be arranged at a pitch two times larger than the cell pitch y in the direction of word lines, permitting easy circuit design and layout of the sense amplifiers.

Figure 10:
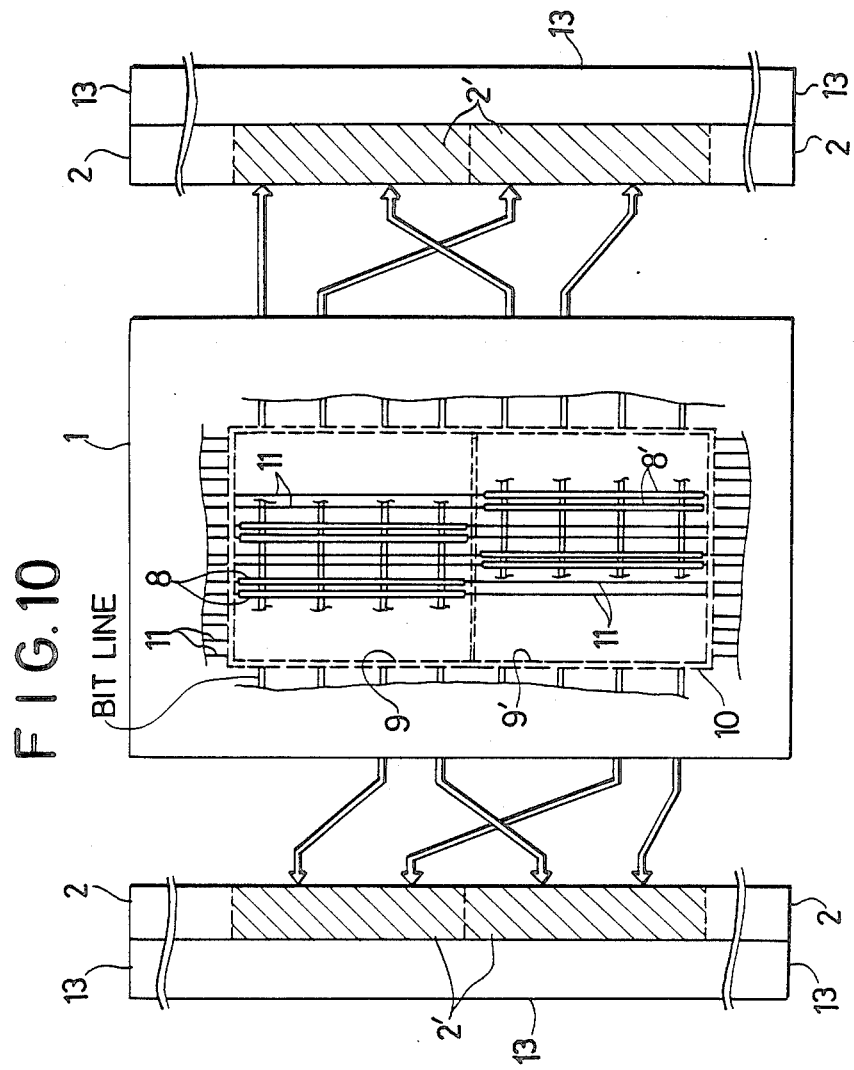
FIG. 10 is a diagram illustrating another embodiment of the present invention in which sense amplifiers and multiplexers are disposed on both sides of the memory cell array in FIG. 8.

Furthermore, such an arrangement as shown in FIG. 10, in which the sense amplifier columns 2 and the multiplexers 13 are disposed on both sides of the memory cell array 1, also retains the advantage of the conventional folded bit line architecture, making it possible to arrange the sense amplifiers at a pitch four times larger than the cell pitch y in the direction of word lines. In FIG. 10, reference numerals are the same as those in FIGS. 7 to 9.

Figure 11:
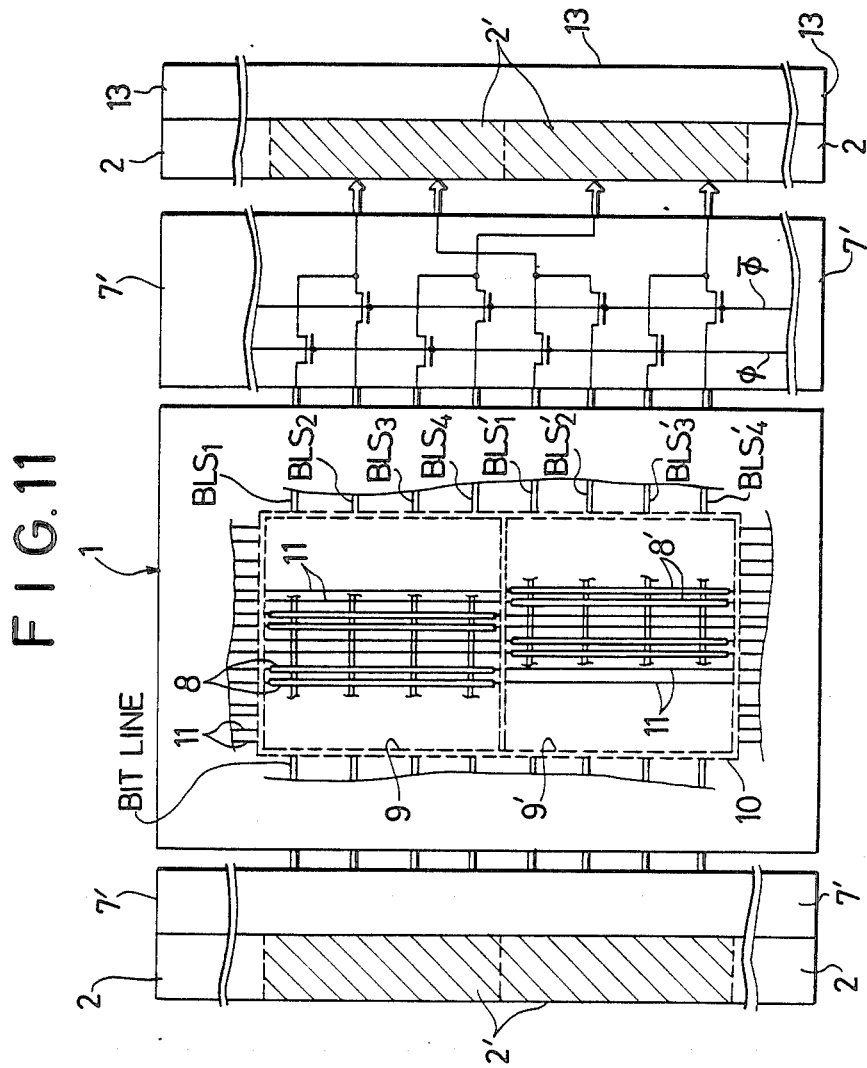
FIG. 11 is a diagram illustrating another embodiment of the present invention in which sense amplifiers and change-over switches are disposed on both sides of the memory cell array in FIG. 8.

Moreover, by employing an arrangement in which the sense amplifier column 2 and the change-over switch 7' are disposed on both sides of the memory cell array 1, as depicted in FIG. 11, cell information can be read and written through the mulitplexer 13 disposed on one side of the memory cell array 1, and the sense amplifiers can be arranged at a pitch four times larger than the pitch y in the direction of word lines. The change-over switch 7' is controlled by control signals $\phi$ and $\bar{\phi}$ 180 degrees out of phase with each other.

A description will be given of the memory cell information readout operation occurring in FIG. 11. For example, when reading out a memory cell at the intersection of the uppermost bit line $BLS_1$ and a specified one of the sub word lines 8 in the first sub array 9, the main word line 11 connected with the sub word line 8 is selected and information of the cell desired to be read out appears on the bit line $BLS_1$. Information read out of the other three memory cells simultaneously selected appear on three other bit lines $BLS_2$, $BLS_3$ and $BSL_4$, respectively. At this point, the change-over switch 7' has already completed its operation according to the logic of the address signal. In this example, those switching transistors of the change-over switch 7' which are connected to odd-numbered bit lines, that is, switching transistors on the left-hand side in FIG. 11, are turned ON, through which the memory cell information appearing on the first and third bit lines $BLS_1$ and $BLS_3$ is provided to the sense amplifier column 2 disposed on the right-hand side of the memory cell array 1. In this instance, the memory cell information desired to be read out is provided to the upper sense amplifier 2' of the sense amplifier column 2. The other two simultaneously selected memory cells are each subjected to a rewrite of information therein by the left-hand side sense amplifier column 2 via the left-hand side change-over switch 7'. When creating reference voltages for memory cell information indentifying use by dummy cells, the dummy cell related to the memory cell information desired to be read out is connected with, for example, the sub word line 8' shown at the right-hand side in the second sub array 9'. By the selection of the main word line 11 related to this sub word line 8', information from the above dummy cells appears on the bit lines in the second sub array 9' substantially at the same time as the memory cell information desired to be read out appears on the bit line BLS$_1$. The dummy cell information related to the upper sense amplifier 2' of the sense amplifier column 2 is transmitted via a switching transistor connected to the uppermost bit line BLS$_1$' in the sub array 9'. Information of the other three dummy cells simultaneously read out appear on three bit lines BLS$_1$', BLS$_2$' and BLS$_3$' in the sub array 9' and are provided to one of the sense amplifier columns 2 on both sides of the memory cell array 1 via either one of the change-over switches 7'. In this way, each sense amplifier column 2 identifies the memory cell information by comparison with the dummy cell information and then amplifies the memory cell information. The memory cell information amplified by the upper sense amplifier 2' of the sense amplifier column 2 disposed on the right-hand side of the memory cell array 1 is applied via the multiplexer 13 to an output circuit for readout. The folded bit line architecture, described above in conjunction with FIGS. 8, 10 and 11, also possesses the advantage that noise resulting from capacitance coupling between the word lines and the bit lines does not effectively affect the operation of the sense amplifier.

While as discussed above the present invention has been described as being applied to the folded bit line architecture, the invention is not limited specifically thereto but may be applied as well to the open bit line architecture. For example, the present invention is applicable to an arrangement in which the memory cell arrays 1 depicted in FIG. 8 are disposed at both sides of the sense amplifier column 2 and the bit lines from the bit lines from the both memory cell arrays 1 form bit line pairs.

Figure 13:
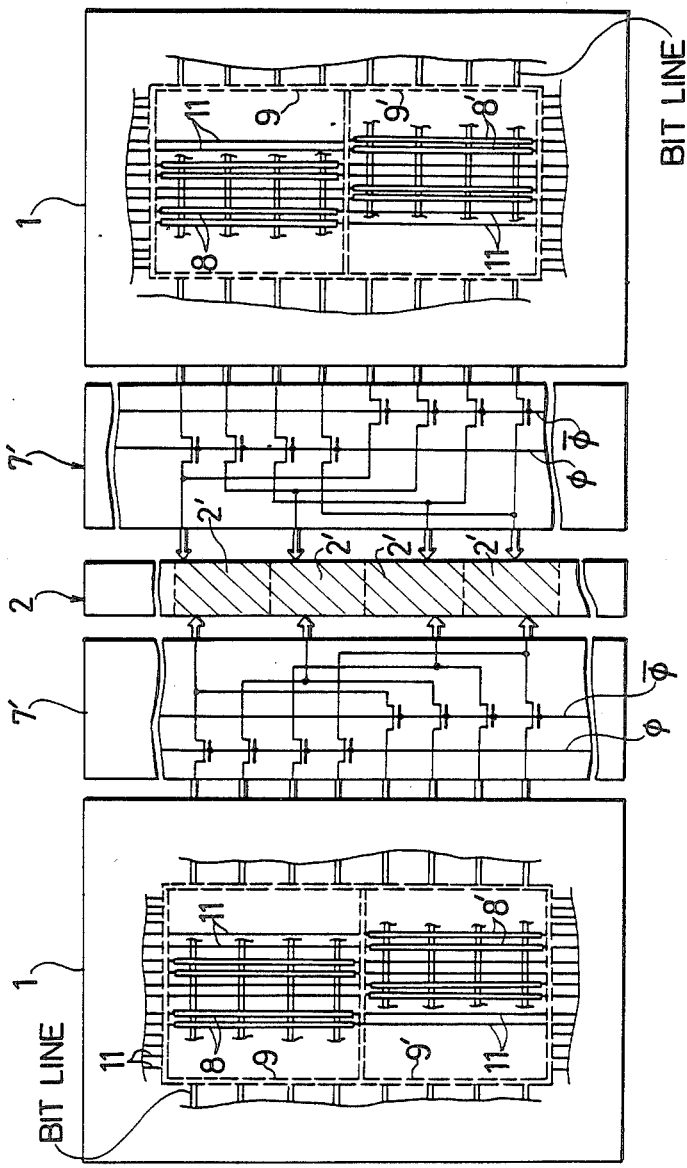
FIG. 13 is a diagram illustrating another embodiment of the present invention which employs the open bit line architecture and uses change-over switches.

FIGS. 12 and 13 illustrate embodiments of the present invention which employ the open bit line architecture in which bit lines from the memory cell arrays 1 on both sides of the sense amplifier column 2 form bit line pairs. In FIGS. 12 and 13 like parts corresponding to those in the foregoing embodiments are identified by the same reference numerals.

FIG. 12 depicts an example which does not use the change-over switch. Since this example is adapted so that the memory cell information appears on the bit lines of either one of the first and second sub arrays 9 and 9' in each memory cell array 1, no change-over switch is needed. In this case, the connection of bit lines of each memory cell array 1 to the sense amplifier column 2 is basically the same as in the case of FIG. 8, however, in FIG. 12 the sense amplifier column 2 and the arrows of bit lines in FIG. 8 are connected to the same nodes N of each sense amplifier 2'.

FIG. 13 illustrates an example which employs the change-over switches 7', which are controlled by the control signals $\phi$ and $\overline{\phi}$ 180° out of phase with each other, as in the case of FIG. 11. In this instance, however, the bit lines of each first sub array 9 are connected by the control signal $\overline{\phi}$ to the sense amplifier column 2 and the bit lines of each second sub array 9' are connected by the control signal $\phi$ to the sense amplifier column 2. With this arrangement, the main word lines 11 are selected one by one in each memory cell array 1. Memory cell information is provided to the sense amplifier column 2 via the bit lines of one of the memory cell arrays 1 and dummy information via the bit lines of the other memory cell array 1. The use of such change-over switches 7' as in this embodiment offers the advantage that the capacitances of nodes of the bit lines to which memory cells are connected can be reduced by half as compared with such capacitances in the arrangement of FIG. 12, and hence is preferable for increased speed of the operation. For this reason, the arrangement including such change-over switches will be widely used in practice.

According to the embodiments of FIGS. 12 and 13, though employing the open bit line architecture, the sense amplifiers can be arranged at a pitch twice the cell pitch y in the direction of word lines, facilitating easy circuit design and layout of the sense amplifiers.

Although the present invention has been described in connection with the two cell-one contact memory cell structure, the invention is not limited specifically thereto and is applicable as well to a one cell-one contact memory cell structure and similar ones.

Furthermore, the present invention is not restricted to the one-layer gate process but can also be applied to, for example, a two-layer gate process, as well.

It will be apparent that many modifications and variations may be effected without departing from the scope of the novel concepts of the present invention.

What is claimed is:

1. A semiconductor memory, comprising:
main word lines and sub word lines;
bit lines intersecting the sub word lines;
a memory cell array divided into a plurality of unit cell arrays and divided into a plurality of sub arrays in a direction perpendicular to said word lines, each unit cell array comprising two different sub arrays, said memory cell array including memory cells disposed at all intersections of the sub word lines and the bit lines and having cell transistors, the sub word lines connected to the cell transistors in a first one of the sub arrays forming one of the unit cell arrays being connected to a first one of the main word lines, the sub word lines connected to cell transistors in a second one of the sub arrays forming the one of the unit cells being connected to a second one of the main word lines, the first main word line passing through the second sub array and the second main word line passing through the first sub array.

2. A semiconductor memory according to claim 1, further comprising a sense amplifier column including sense amplifiers, where the bit lines belonging to the first and second sub arrays of the unit cell array form bit line pairs and the bit lines of each bit line pair are connected to one sense amplifier of the sense amplifier column.

3. A semiconductor memory according to claim 2, wherein the sense amplifier column is disposed on one side of the memory cell array.

4. A semiconductor memory according to claim 2, wherein the sense amplifier column includes sense amplifiers with first and second input terminals, the sense amplifiers being disposed on both sides of the memory cell array and the bit line pairs are each connected to one of the sense amplifiers.

5. A semiconductor memory according to claim 2, wherein the sense amplifier column includes sense amplifiers and said memory further comprises change-over switches, the sense amplifiers and change-over switches are disposed on both sides of the memory cell array, and the bit line pairs are each connected via one of the change-over switches to one of the sense amplifiers.

6. A semiconductor memory according claim 2, wherein sub arrays adjoining a direction perpendicular to the main word lines are combined into the unit cell array and the unit cell arrays are each folded symmetrically with respect to the boundary between the adjoining unit cell arrays to form the memory cell array.

7. A semiconductor memory according to claim 6, wherein sub word lines of the sub arrays of the adjoining unit cell arrays are interconnected, said memory further comprising one through hole for each interconnected sub word line, and the respective sub word lines are alternately connected to different main word lines through the through holes.

8. A semiconductor memory according to claim 2, wherein sub arrays adjoining in a direction perpendicular to the main word lines are combined into the unit cell array and the unit cell arrays are sequentially arranged to form the memory cell array.

9. A semiconductor memory according to claim 1, further comprising a sense amplifier column and where the memory cell arrays are disposed on both sides of said sense amplifier column, the bit lines of the first sub array and the bit lines of the second sub array of each unit cell array are interconnected one by one, the interconnected bit lines of one of the first sub arrays are each connected to the first input terminal of one of the sense amplifiers of the sense amplifier column, the interconnected bit lines of the second sub arrays are each connected to the second input terminal of the one of the sense amplifiers of the sense amplifier column, and the bit lines from the first and second sub arrays form bit line pairs.

10. A semiconductor memory according to claim 1, wherein the memory cell array is divided into group memory cell arrays and said memory further comprises changeover switches and a sense amplifier column including sense amplifiers therein, the group memory cell arrays and the change-over switches are disposed on both sides of the sense amplifier column, the bit lines of the respective sub arrays of the unit cell arrays of each memory cell array are each connected via the change-over switch on the corresponding side thereof to one of the sense amplifiers of the sense amplifier column, the bit lines from the cell arrays on both sides form bit line pairs, each change-over switch connects one of the sense amplifiers of the sense amplifier column to each of the bit lines of one sub array in dependence on a first control signal and connects the sense amplifier of the sense amplifier column to each of the bit lines of the other sub array in dependence on a second control signal.

* * * * *